(12) United States Patent
Roohparvar et al.

(10) Patent No.: US 7,751,242 B2
(45) Date of Patent: Jul. 6, 2010

(54) NAND MEMORY DEVICE AND PROGRAMMING METHODS

(75) Inventors: Frankie F. Roohparvar, Monte Sereno, CA (US); Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 11/215,990

(22) Filed: Aug. 30, 2005

(65) Prior Publication Data

US 2007/0047310 A1    Mar. 1, 2007

(51) Int. Cl.
G11C 11/34 (2006.01)
(52) U.S. Cl. .................... 365/185.12; 365/185.17; 365/185.22; 365/185.29; 365/185.33
(58) Field of Classification Search ............ 365/185.03, 365/185.12, 185.17, 185.22, 185.33, 185.29
See application file for complete search history.

(56) References Cited

U.S. PATENT DOCUMENTS

| | | | |
|---|---|---|---|
| 5,270,972 A | 12/1993 | Craig et al. | |
| 6,075,381 A | 6/2000 | LaBerge | |
| 6,137,717 A | 10/2000 | Sakamoto | |
| 6,285,597 B2 | 9/2001 | Kawahara et al. | |
| 6,295,227 B1 * | 9/2001 | Sakui et al. | 365/185.17 |
| 6,373,740 B1 | 4/2002 | Forbes et al. | |
| 6,452,869 B1 * | 9/2002 | Parker | 365/185.12 |
| 6,458,687 B1 | 10/2002 | Eldridge | |
| 6,576,542 B2 | 6/2003 | Ahn | |
| 6,586,979 B2 | 7/2003 | Gromm et al. | |
| 6,717,862 B2 | 4/2004 | Naso et al. | |
| 6,744,082 B1 | 6/2004 | Forbes et al. | |
| 6,894,532 B2 | 5/2005 | Forbes et al. | |
| 6,919,735 B2 | 7/2005 | Porter et al. | |
| 6,927,998 B2 | 8/2005 | Takeuchi et al. | |
| 6,958,938 B2 | 10/2005 | Noguchi et al. | |
| 6,970,053 B2 | 11/2005 | Akram et al. | |
| 6,975,542 B2 | 12/2005 | Roohparvar | |
| 6,977,842 B2 | 12/2005 | Nazarlan | |
| 6,982,905 B2 | 1/2006 | Nguyen | |
| 7,145,806 B2 | 12/2006 | Kawai | |
| 7,173,859 B2 * | 2/2007 | Hemink | 365/185.03 |
| 7,173,863 B2 | 2/2007 | Conley | |
| 7,193,898 B2 * | 3/2007 | Cernea | 365/185.22 |
| 7,227,778 B2 | 6/2007 | Yamada | |
| 7,307,878 B1 * | 12/2007 | Lee et al. | 365/185.22 |
| 2007/0153579 A1 | 7/2007 | Roohparvar et al. | |

OTHER PUBLICATIONS

"U.S. Appl. No. 11/714,542, Non-Final Office Action mailed Jul. 13, 2007", 9 pgs.

* cited by examiner

Primary Examiner—Trong Phan
(74) Attorney, Agent, or Firm—Schwegman, Lundberg & Woessner, P.A.

(57) ABSTRACT

A NAND Flash memory device is described that can reduce bit line coupling and floating gate coupling during program and verify operations. Consecutive bit lines of an array row are concurrently programmed as a common page. Floating gate coupling during programming can therefore be reduced. Multiple verify operations are performed on separate bit lines of the page. Bit line coupling can therefore be reduced.

6 Claims, 5 Drawing Sheets

NAND MEMORY DEVICE AND PROGRAMMING METHODS

FIELD OF THE INVENTION

The present invention relates to non-volatile memory devices and, more particularly, to NAND flash memory devices.

BACKGROUND

Flash memory is non-volatile, which means that it stores information on a semiconductor in a way that does not need power to maintain the information in the chip. Flash memory stores information in an array of transistors, called "cells," each of which traditionally stores one or more bits of information. The memory cells are based on the Floating-Gate Avalanche-Injection Metal Oxide Semiconductor (FAMOS transistor) which is essentially a Complimentary Metal Oxide Semiconductor (CMOS) Field Effect Transistor (FET) with an additional conductor suspended between the gate and source/drain terminals. Current flash memory devices are made in two forms: NOR flash and NAND flash. The names refer to the type of logic used in the storage cell array.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current can be sensed and translated into 1's and 0's, reproducing the stored data.

Memory cells of memory devices are typically arranged in an array with rows and columns. Generally, the rows are coupled via a word line conductor and the columns are coupled via a bit line conductor. During data read and write functions, voltage coupling between bit lines can influence proper memory operation. Further, close physical proximity of memory cells can result in floating gate to floating gate coupling. Again, coupling can influence proper memory operation and data accuracy.

For reasons stated below which will become apparent to those skilled in the art upon reading and understanding the present specification, there is a need for methods and devices to program and verify non-volatile memory devices.

SUMMARY

In one embodiment, a NAND Flash memory device includes an array of floating gate transistor memory cells arranged in rows having X columns. A row of memory cells are coupled to a word line conductor and a column of memory cells are coupled to a bit line. A control circuit performs a write operation on the memory cells, wherein the write operation simultaneously programs data to memory cells coupled to the X columns.

In another embodiment, a method of writing data to a NAND Flash memory includes receiving write data to be written to a memory array row having first, second, third and fourth memory cells respectively coupled to first, second, third and fourth bit line conductors. The first, second, third and fourth bit line conductors are physically located adjacently in the memory. The method further includes performing a program operation on the first, second, third and fourth memory cells by coupling the write data to the first, second, third and fourth bit line conductors.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice, as is well known in the art. The figures are provided to help facilitate an understanding of the detailed description, are not intended to be accurate in scale, and have been simplified. The term conductor as used herein is intended to include conductors and semi-conductors, including but not limited to metals, metal alloy, doped silicon and polysilicon.

The following detailed description is, therefore, not to be taken in a limiting sense, and the scope of the present invention is defined only by the appended claims, along with the full scope of equivalents to which such claims are entitled.

Figure 1:
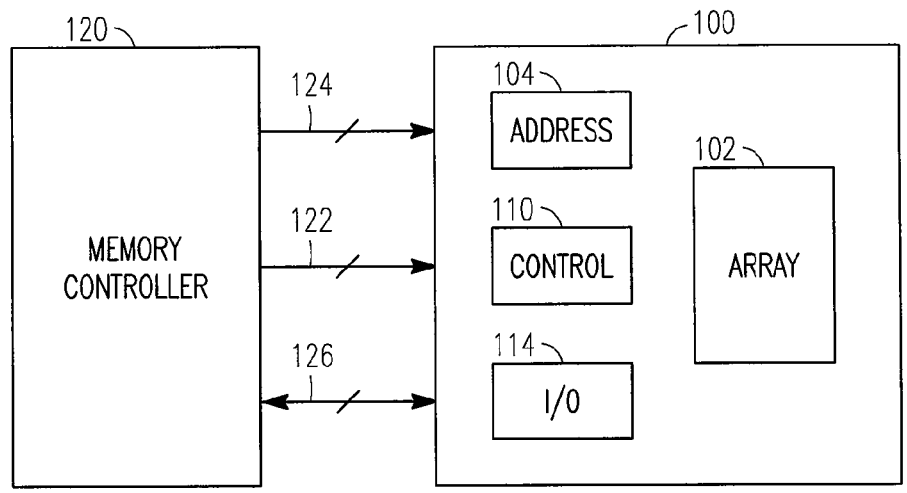
FIG. 1 is a block diagram of a memory device according to embodiments of the present invention.

FIG. 1 is a simplified block diagram of an integrated circuit memory device 100 in accordance with an embodiment of the invention. The memory device 100 includes an array of non-volatile floating gate memory cells 102, address circuitry 104, control circuitry 110, and Input/Output (I/O) circuitry 114. The memory cells are also referred to as Flash memory cells because blocks of memory cells are typically erased concurrently, in a flash operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data can be written to or read from the memory cells across data, DQ, lines 126.

In addition to general memory functions, control circuit 110 performs a write operation on the memory cells. As explained below, the write operation includes simultaneously programming data to memory cells coupled to X columns of a row. The write operation includes a first verify operation to check data accuracy of memory cells coupled to a first one-half of the X columns, and a subsequent second verify operation to check data accuracy of memory cells coupled to a second one-half of the X columns.

Explained below is a method of writing to a NAND Flash memory including performing a program operation on floating gate transistor memory cells consecutively coupled to a common control gate conductor.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Figure 2:
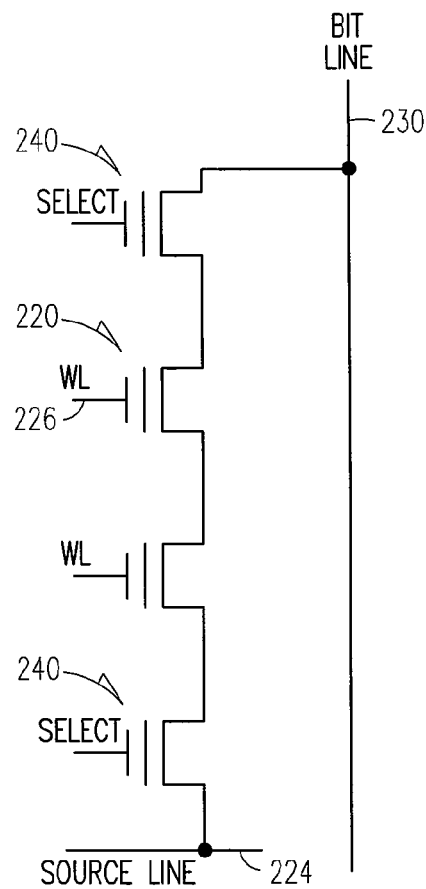
FIG. 2 illustrates a simplified portion of a prior art NAND flash memory array.

FIG. 2 illustrates a simplified portion of a prior art NAND flash memory array. NAND Flash uses tunnel injection for writing and tunnel release for erasing. The NAND memory includes floating gate memory cells 220 coupled to source line 224, word lines 226 and a bit line 230. The cells are coupled in series between the bit line and source line. One or more bit line select transistors 240 are used to selectively isolate the cells from the bit and source lines.

In a read operation, a word line of a target (selected) memory cell can be maintained at a low voltage level. All unselected cell word lines are coupled to a voltage sufficiently high to activate the unselected cells regardless of their floating gate charge. If the selected cell has an uncharged floating gate, it is activated. The bit line and source line are then coupled through the series of memory cells. If the selected cell has a charged floating gate, it will not activate. The bit line and source lines, therefore, are not coupled through the series of memory cells.

Because of the close proximity of the memory cells, bit line coupling can be a problem during reading/sensing operations. That is, the length and close spacing of adjacent bit lines results in voltage noise on bit lines. Of particular concern is bit line coupling during write verify operations. As known to those skilled in the art, a write operation typically includes one or more program steps and one or more read/verify steps.

Figure 3:
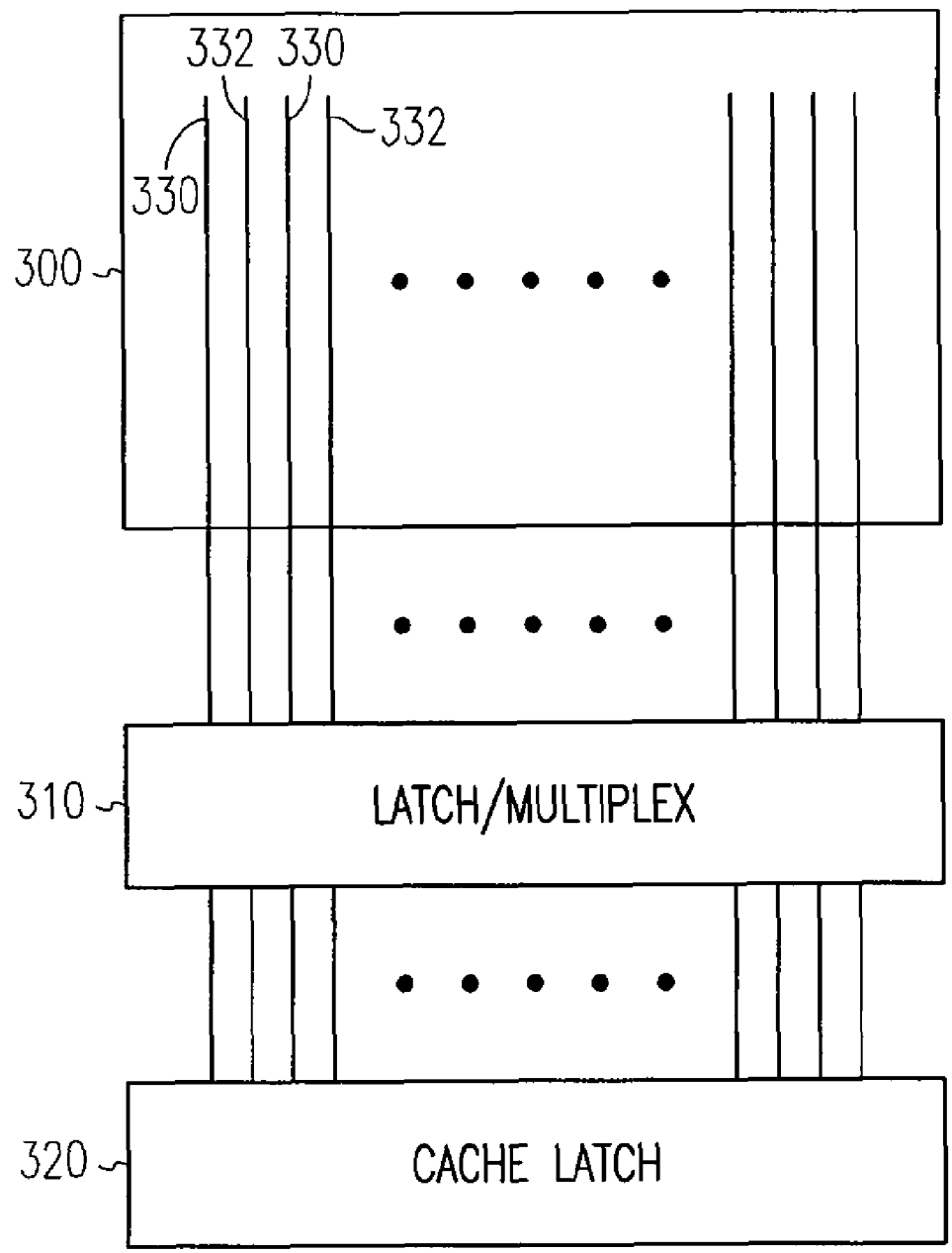
FIG. 3 is a block diagram of a prior art NAND flash.

To address the bit line coupling issue, prior art NAND flash memories divide word lines (rows) into two logical pages, see FIG. 3. The pages are interwoven such that alternating bit lines 330 and 332 of array 300 belong to different pages. During operation, one page can be active and the other page can be inactive. The bit lines of the inactive page are coupled to a high potential, such as Vcc, during a program operation. The Vcc biased bit lines, therefore, prevent memory cells coupled to a common word line from being programmed. The prior art memory page configuration, however, contributes to floating gate to floating gate coupling during program operations. That is, the physical proximity of the floating gates of the memory cells can contribute to floating gate coupling during program operations.

During read/verify operations, the prior art couples the bit lines of the inactive page to a low potential, such as ground, to provide shielding for bit line coupling. As illustrated in FIG. 3, the prior art NAND memory word lines are divided into first and second 'pages.' A latch and multiplex circuit 310 are used to couple data to an active one of the pages and bias bit lines of the non-active page. Optionally, a second latch 320 can be provided in the prior art devices to cache data for the second page, while writing to the first page.

Figure 4A:
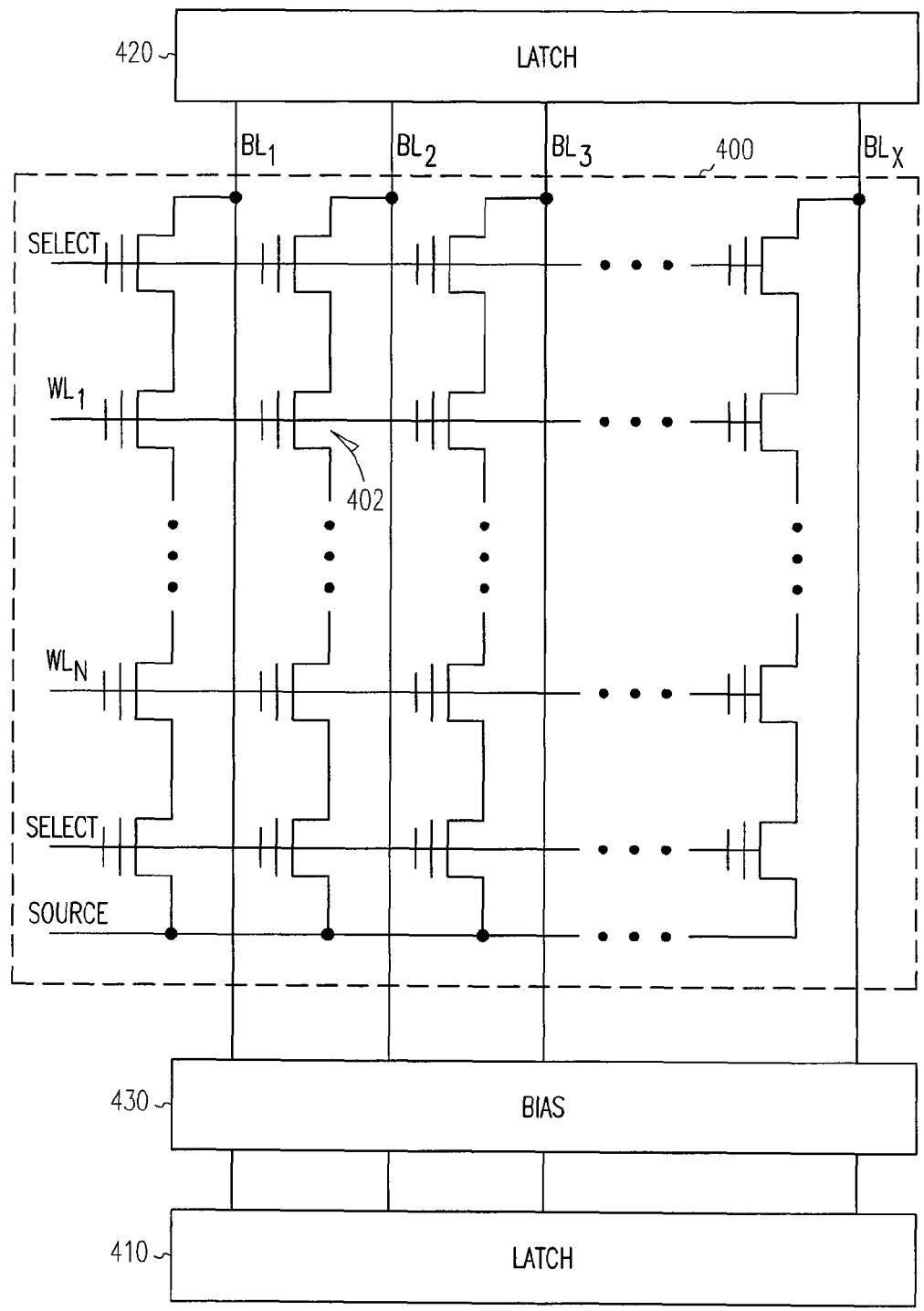
FIG. 4A illustrates a simplified portion of a NAND flash memory array according to embodiments of the present invention.
Figure 4B:
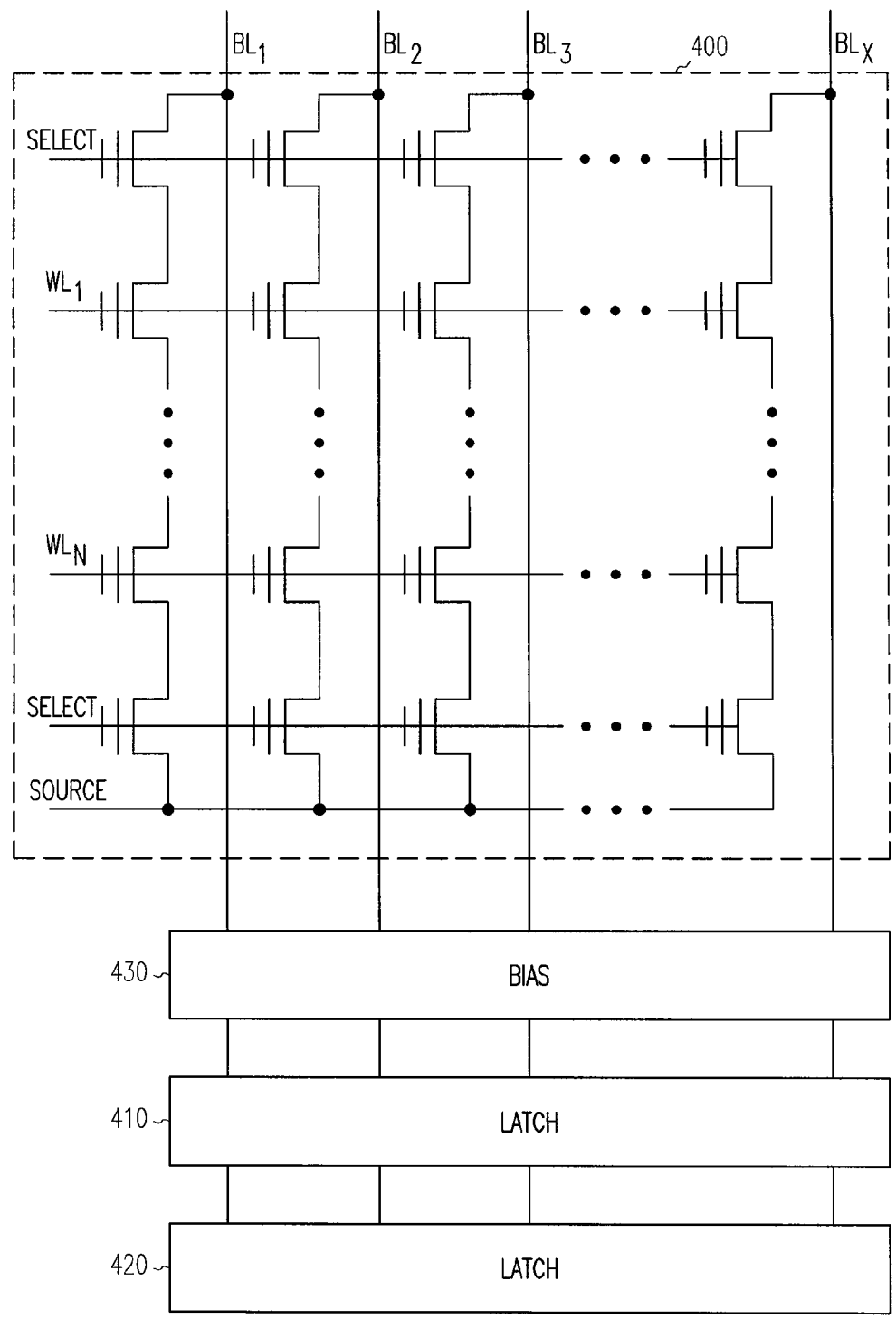
FIG. 4B illustrates another simplified portion of a NAND flash memory array according to embodiments of the present invention.

Embodiments of the present invention organize word lines, or rows, of the NAND Flash memory array as a single continuous page. FIGS. 4A and 4B illustrate simplified NAND Flash array and support circuitry of embodiments of the present invention. NAND array 400 includes memory cells 402 coupled to word lines (WL1 to WLn). Each word line has X memory cells coupled to bit lines (BL1 to BLx). A bias circuit 430 can be provided to bias the bit lines during verification operations. The bias circuit can be a multiplex circuit to couple the bit lines to a ground potential. Write registers or latches 410 and 420 are provided to hold data to be written to the memory cells. It will be understood by those skilled in the art with the present disclosure that the latches can be separate or combined circuits.

During write operations, all of the bit lines for a word line are coupled for programming the memory cells of the word line. Thus, all X memory cells of a row are programmed at one time.

To reduce bit line coupling during the verification steps, verification of the programmed cells can be performed in two phases on alternating bit lines. For example, during a first phase a first one-half of the bit lines are verified while a second one-half are coupled to a fixed potential, such as ground potential. The second phase verifies the second one-half of the bit lines while the first one-half are coupled to the fixed potential. It is noted that a single program operation followed by two verify operations is a reduction in total programming time from the prior programming methods that require two program operations and two verify operations.

As illustrated in FIGS. 4A and 4B, two or more registers, or latches 410 and 420, are provided to hold program data for a memory array page. The registers can be physically located on opposite sides of the bit lines as illustrated in FIG. 4A. This layout can reduce metal line congestion. Alternatively, as shown in FIG. 4B, the registers can be located on a common side of the bit lines.

Figure 5:
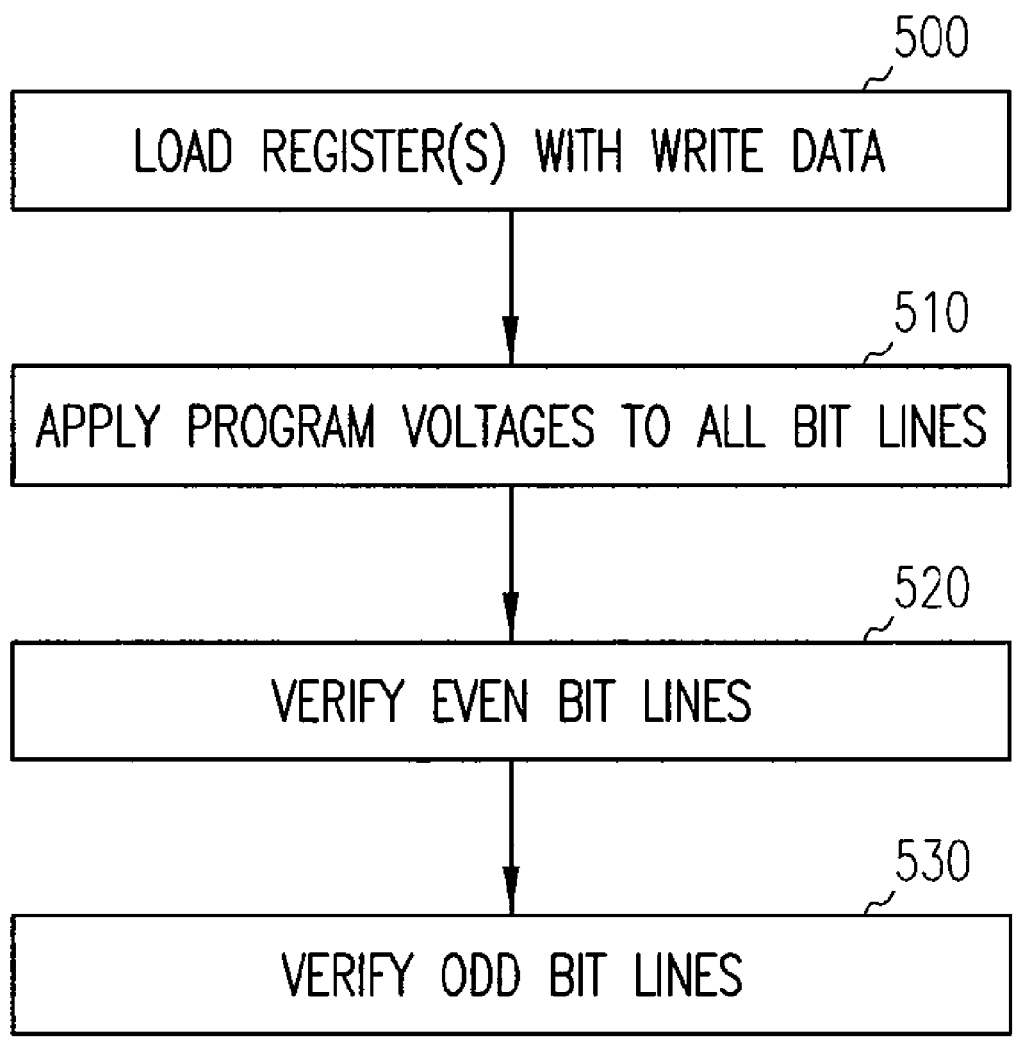
FIG. 5 is a flow chart of program and verify methods according to embodiments of the present invention.

During programming, as illustrated in the flow chart of FIG. 5, data can be loaded into both registers 500 and coupled to their respective bit lines. Appropriate voltages levels are applied to the bit lines, word line and source to program 510 the memory cells. After applying the programming voltages, a read verify can be performed on a first one-half of the cells, for example the even bit lines 520 to determine if the memory cells were programmed correctly. After performing a verification operation on the first one-half of the bit lines, a read verify can be performed on a second one-half of the bit lines 530 to determine if the memory cells were programmed correctly. Bit lines not subject to a read verify operation are coupled to a ground potential to provide shielding against bit line coupling.

A method of writing data to a NAND Flash memory includes receiving write data to be written to a memory array row having first, second, third and fourth memory cells respectively coupled to first, second, third and fourth bit line conductors. The first, second, third and fourth bit line conductors are physically located adjacently in the memory. The method further includes storing the write data for the first and second memory cells in a first memory register, and storing the write data for the third and fourth memory cells in a second memory register. A program operation can be performed on the first, second, third and fourth memory cells, wherein the program operation includes coupling the write data to the first, second, third and fourth bit line conductors. A first verify operation can be performed to check data accuracy of the first and third memory cells, and a subsequent second verify operation can be performed to check data accuracy of the second and fourth memory cells.

A NAND Flash memory device has been described that can reduce bit line coupling and floating gate coupling during program and verify operations. Consecutive bit lines of an array row are concurrently programmed as a common page. Floating gate coupling during programming can therefore be reduced. Multiple verify operations are performed on separate bit lines of the page. Bit line coupling can therefore be reduced.

The invention claimed is:

1. A NAND Flash memory device comprising:
an array of floating gate transistor memory cells arranged in rows having X columns, wherein a row of memory cells are coupled to a word line conductor and a column of memory cells are coupled to a bit line;
a control circuit to perform a write operation on the memory cells, wherein the write operation comprises simultaneously programming data to a first half and a second half of memory cells coupled to the X columns; and
wherein the write operation further comprises alternating bit lines during verification by using a first verify operation to check data accuracy of memory cells coupled to the first one-half of the X columns, and a subsequent second verify operation to check data accuracy of memory cells coupled to the second one-half of the X columns.

2. The NAND Flash memory of claim 1 further comprising:
a first data register to store write data for memory cells coupled to a first one-half of the X columns; and
a second data register to store write data for memory cells coupled to a second one-half of the X columns.

3. The NAND Flash memory of claim 1 wherein the first and second data registers are located on opposite ends of the X columns.

4. A NAND Flash memory device comprising:
an array of floating gate transistor memory cells arranged in at least one row having X memory cells;
a control circuit to perform a page write operation on the memory cells, wherein the page write operation comprises simultaneously programming data to a first half and a second half of the X memory cells;
a first data register to store write data for the first one-half of the X memory cells;
a second data register to store write data for the second one-half of the X memory cells; and
wherein the page write operation further comprises alternating bit lines during verification by using a first verify operation to check data accuracy of the first one-half of the X memory cells, and a subsequent second verify operation to check data accuracy of the second one-half of the X memory cells.

5. A system comprising:
a memory controller; and
a NAND Flash memory coupled to communicate with the memory controller comprising,
an array of floating gate transistor memory cells arranged in at least one row having X memory cells, and
a control circuit to perform a page write operation on the memory cells in response to commands from the memory controller, wherein the page write operation comprises simultaneously programming data to a first half and a second half of the X memory cells;
wherein the page write operation further comprises alternating bit lines during verification by using a first verify operation to check data accuracy of the first one-half of the X memory cells, and a subsequent second verify operation to check data accuracy of the second one-half of the X memory cells.

6. The system of claim 5 wherein the NAND Flash memory further comprises:
a first data register to store write data for a first one-half of the X memory cells, and
a second data register to store write data for a second one-half of the X memory cells.

* * * * *